(12) United States Patent
Do et al.

(10) Patent No.: US 8,815,643 B2
(45) Date of Patent: Aug. 26, 2014

(54) METHOD OF FABRICATING SEMICONDUCTOR DIE WITH THROUGH-HOLE VIA ON SAW STREETS AND THROUGH-HOLE VIA IN ACTIVE AREA OF DIE

(75) Inventors: Byung Tai Do, Singapore (SG); Heap Hoe Kuan, Singapore (SG); Linda Pei Ee Chua, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 144 days.

(21) Appl. No.: 13/021,856

(22) Filed: Feb. 7, 2011

(65) Prior Publication Data

US 2011/0124156 A1 May 26, 2011
US 2012/0244661 A9 Sep. 27, 2012

Related U.S. Application Data

(60) Division of application No. 11/861,251, filed on Sep. 25, 2007, now Pat. No. 7,902,638, which is a continuation-in-part of application No. 11/768,844, filed on Jun. 26, 2007, now Pat. No. 7,723,159, which is a continuation-in-part of application No. 11/744,657, filed on May 4, 2007, now Pat. No. 7,569,421.

(51) Int. Cl.
*H01L 21/82* (2006.01)
*H01L 23/00* (2006.01)
*H01L 23/48* (2006.01)
*H01L 21/683* (2006.01)
*H01L 25/03* (2006.01)
*H01L 25/065* (2006.01)
*H01L 21/768* (2006.01)
*H01L 25/00* (2006.01)
*H01L 23/31* (2006.01)

(52) U.S. Cl.
CPC ... *H01L 21/6835* (2013.01); *H01L 2224/81801* (2013.01); *H01L 2924/19107* (2013.01); *H01L 2225/06506* (2013.01); *H01L 2224/32225* (2013.01); *H01L 2224/48091* (2013.01); *H01L 2924/01013* (2013.01); *H01L 2924/014* (2013.01); *H01L 2924/30105* (2013.01); *H01L 2924/01074* (2013.01); *H01L 24/19* (2013.01); *H01L 2225/06527* (2013.01); *H01L 23/3128* (2013.01); *H01L 2224/48472* (2013.01); *H01L 23/481* (2013.01); *H01L 2225/06541* (2013.01); *H01L 2924/01078* (2013.01); *H01L 2224/73265* (2013.01); *H01L 24/82* (2013.01); *H01L 25/03* (2013.01); *H01L 2924/01005* (2013.01); *H01L 2924/01006* (2013.01); *H01L 24/81* (2013.01); *H01L 2924/15311* (2013.01); *H01L 2224/18* (2013.01); *H01L 2225/06513* (2013.01); *H01L 2924/01023* (2013.01); *H01L 25/0657* (2013.01); *H01L 2224/82039* (2013.01); *H01L 2924/14* (2013.01); *H01L 21/76898* (2013.01); *H01L 2224/16227* (2013.01); *H01L 2924/01029* (2013.01); *H01L 24/48* (2013.01); *H01L 2224/48227* (2013.01); *H01L 25/50* (2013.01); *H01L 2224/48145* (2013.01); *H01L 2224/32145* (2013.01); *H01L 2924/01033* (2013.01)
USPC .............. 438/114; 438/672; 257/E21.499; 257/E23.145

(58) Field of Classification Search
USPC .............. 438/113, 114, 462, 667, 672; 257/E21.499, E23.145
See application file for complete search history.

(56) References Cited

U.S. PATENT DOCUMENTS

| | | | |
|---|---|---|---|
| 5,694,551 A | 12/1997 | Doyle et al. | |
| 6,157,915 A | 12/2000 | Bhaskaran et al. | |
| 6,400,008 B1 | 6/2002 | Farnworth | |
| 6,743,696 B2 | 6/2004 | Jeung et al. | |
| 7,506,438 B1 * | 3/2009 | Fu et al. | 29/852 |
| 2002/0013721 A1 | 1/2002 | Dabbiere et al. | |
| 2002/0019761 A1 | 2/2002 | Lidow | |
| 2002/0042755 A1 | 4/2002 | Kumar et al. | |
| 2002/0049622 A1 | 4/2002 | Lettich et al. | |
| 2004/0110323 A1 * | 6/2004 | Becker et al. | 438/127 |
| 2005/0186705 A1 | 8/2005 | Jackson et al. | |
| 2006/0019467 A1 * | 1/2006 | Lee et al. | 438/462 |
| 2006/0043533 A1 * | 3/2006 | Lake | 257/618 |

OTHER PUBLICATIONS

"Separate." Dictionary.com Unabridged. Random House, Inc. May 28, 2013. <Dictionary.com http://dictionary.reference.com/browse/separate>.*

"Through." Dictionary.com Unabridged. Random House, Inc. May 28, 2013. <Dictionary.com http://dictionary.reference.com/browse/through>.*

* cited by examiner

*Primary Examiner* — Wensing Kuo

(74) *Attorney, Agent, or Firm* — Robert D. Atkins; Patent Law Group: Atkins and Associates, P.C.

(57) ABSTRACT

A semiconductor wafer contains a plurality of die with contact pads disposed on a first surface of each die. Metal vias are formed in trenches in the saw street guides and are surrounded by organic material. Traces connect the contact pads and metal vias. The metal vias can be half-circle vias or full-circle vias. Metal vias are also formed through the contact pads on the active area of the die. Redistribution layers (RDL) are formed on a second surface of the die opposite the first surface. Repassivation layers are formed between the RDL for electrical isolation. The die are stackable and can be placed in a semiconductor package with other die. The vias through the saw streets and vias through the active area of the die, as well as the RDL, provide electrical interconnect to the adjacent die.

30 Claims, 15 Drawing Sheets

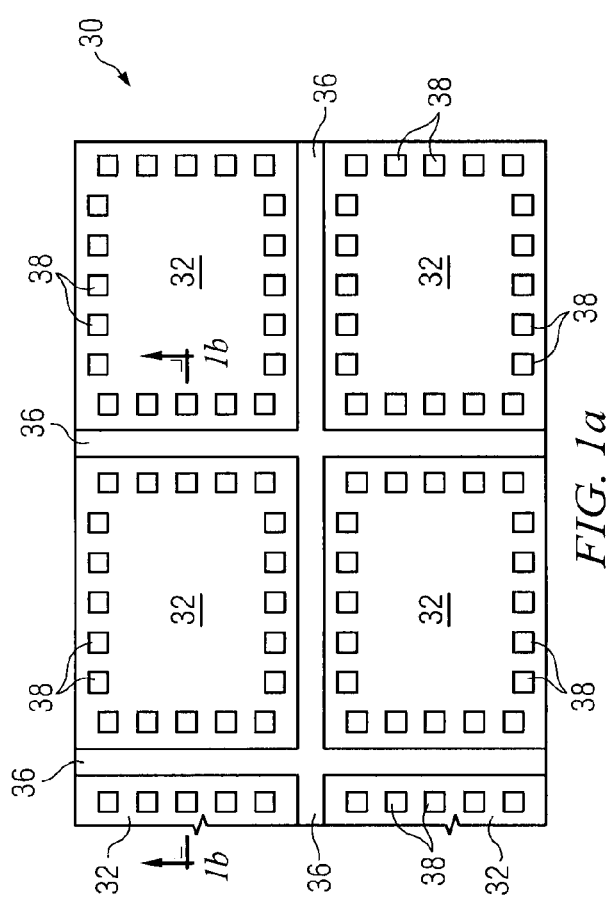
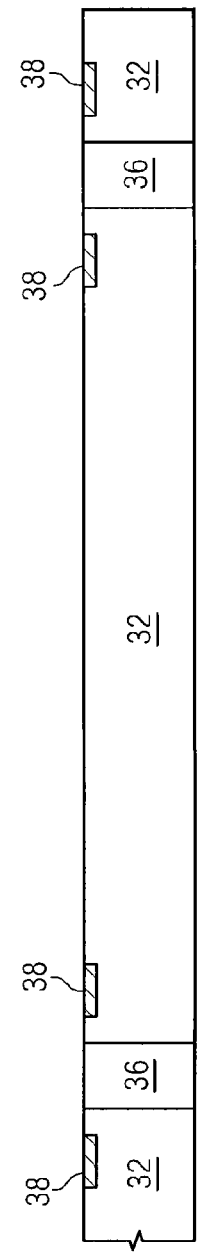
FIG. 1a
FIG. 1b

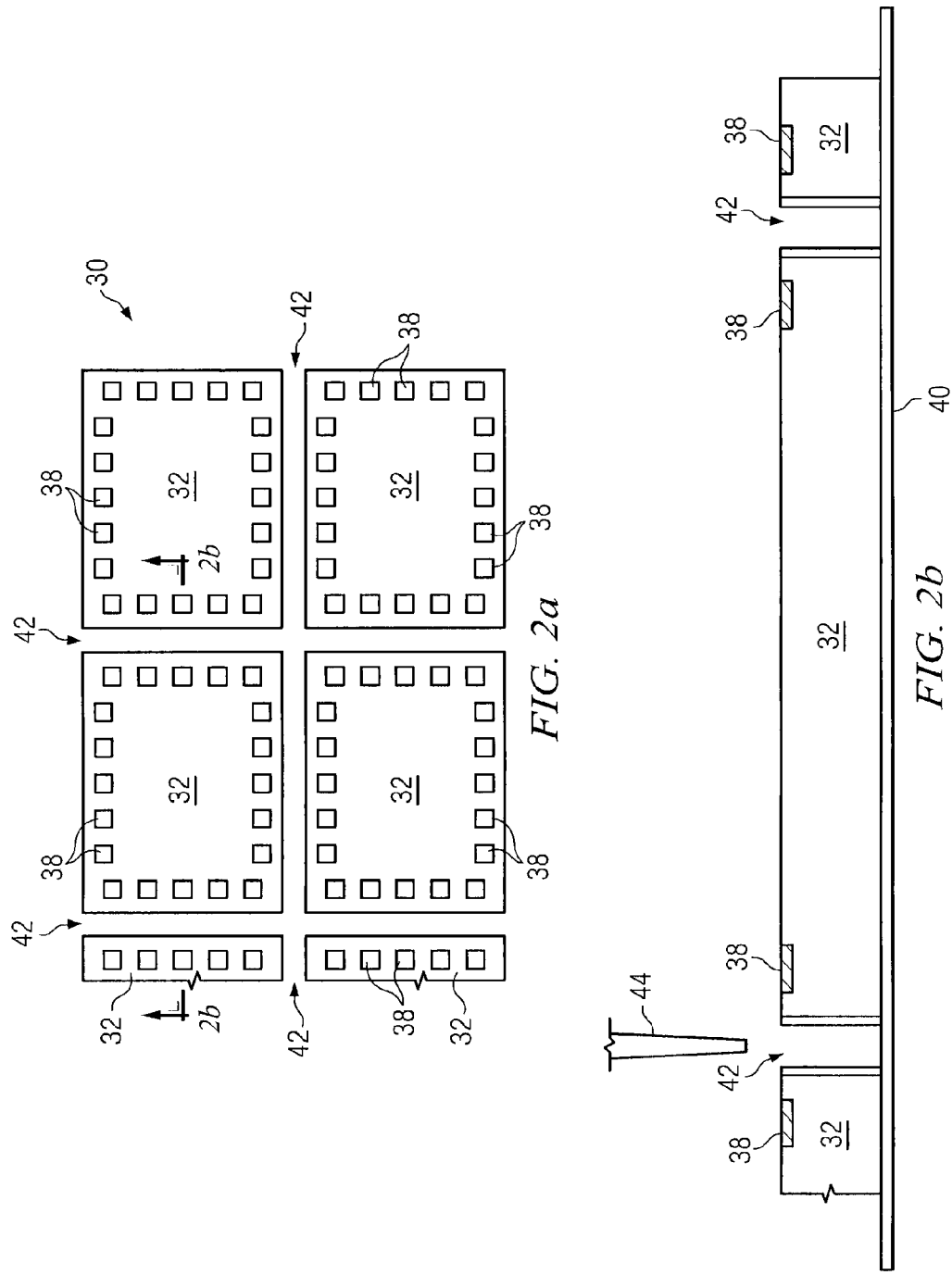

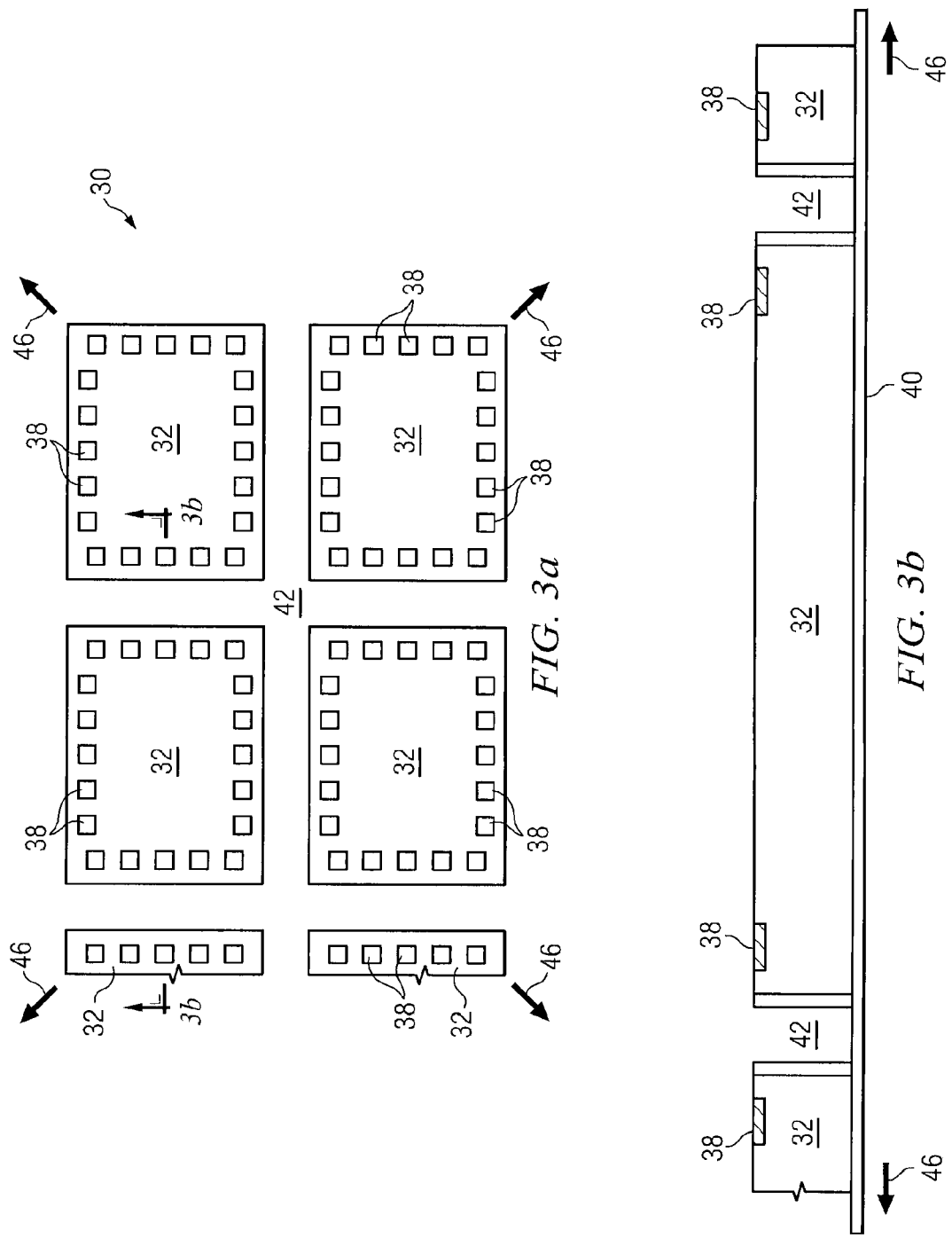

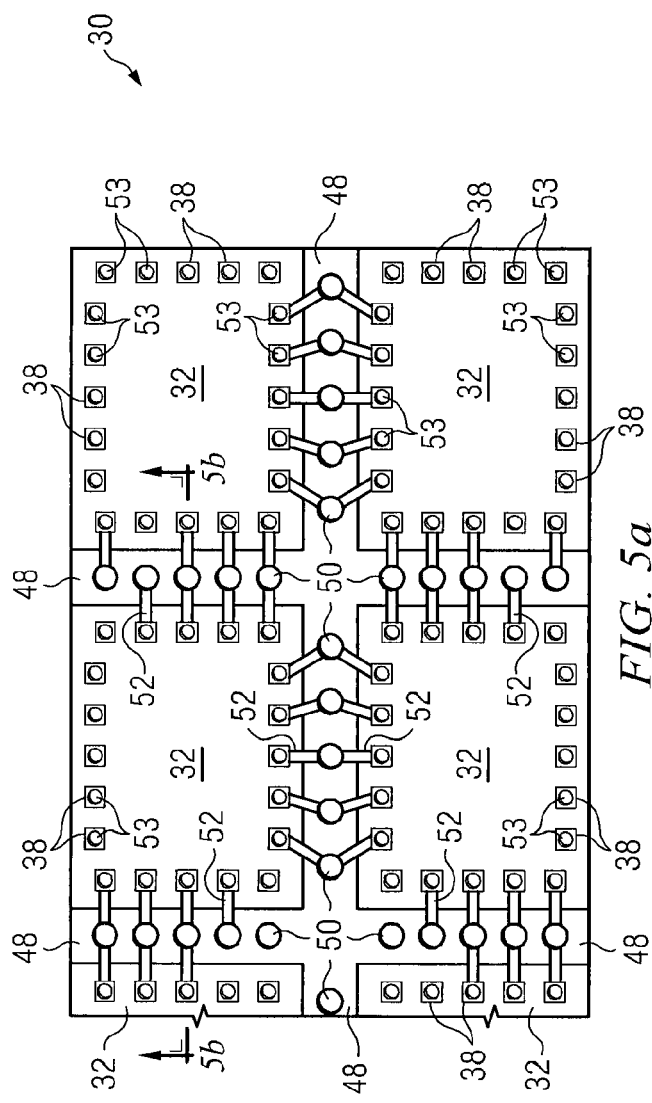
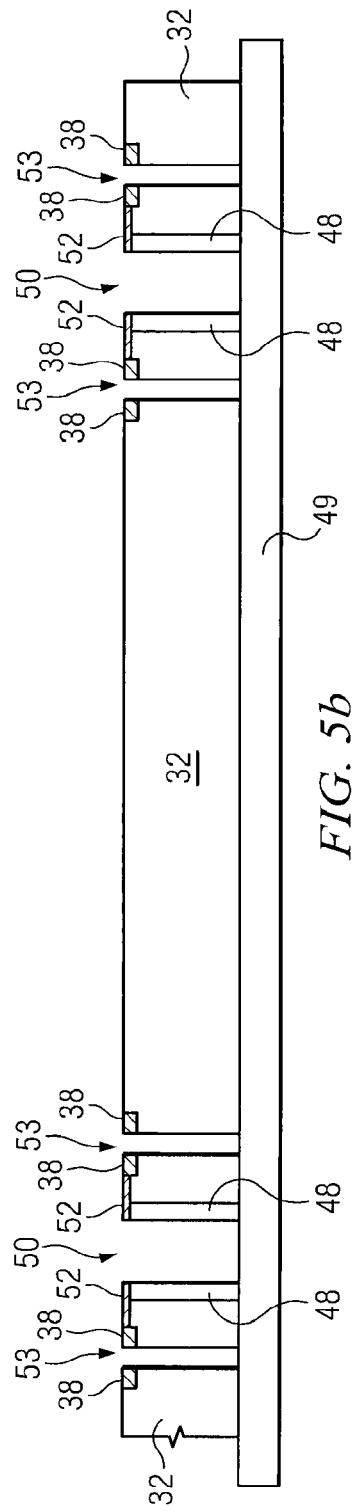
FIG. 5a
FIG. 5b

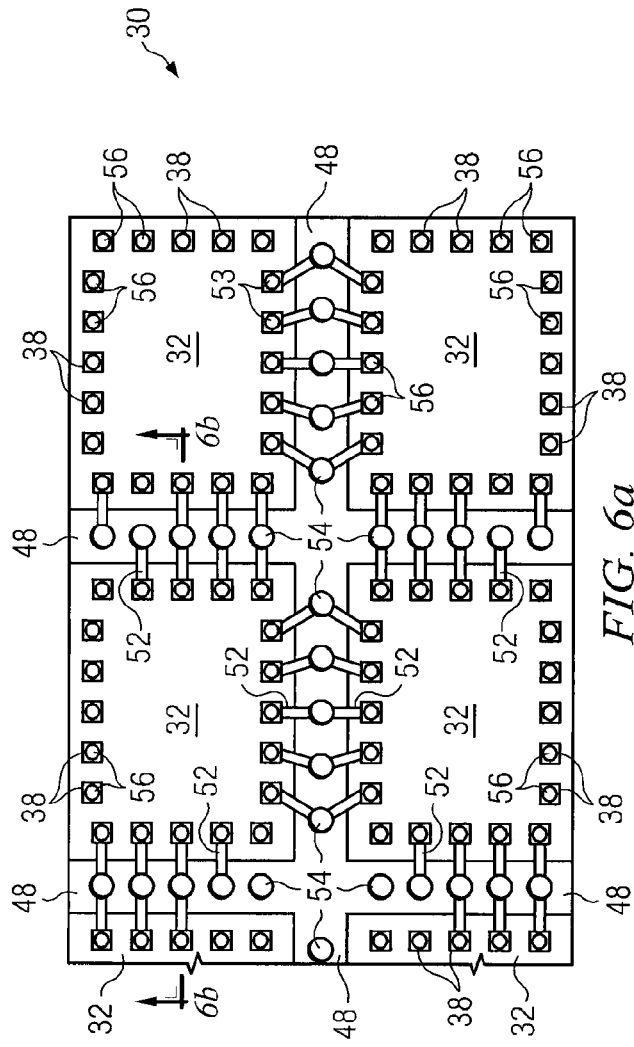
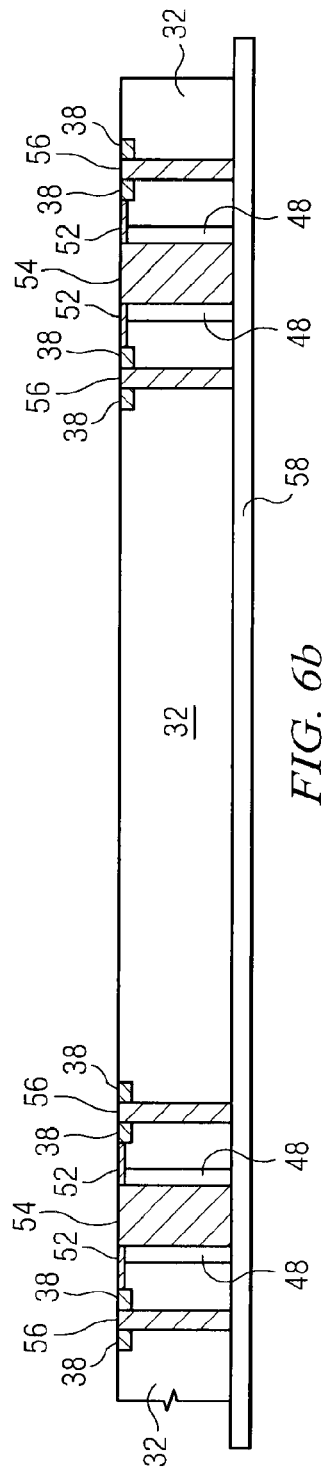

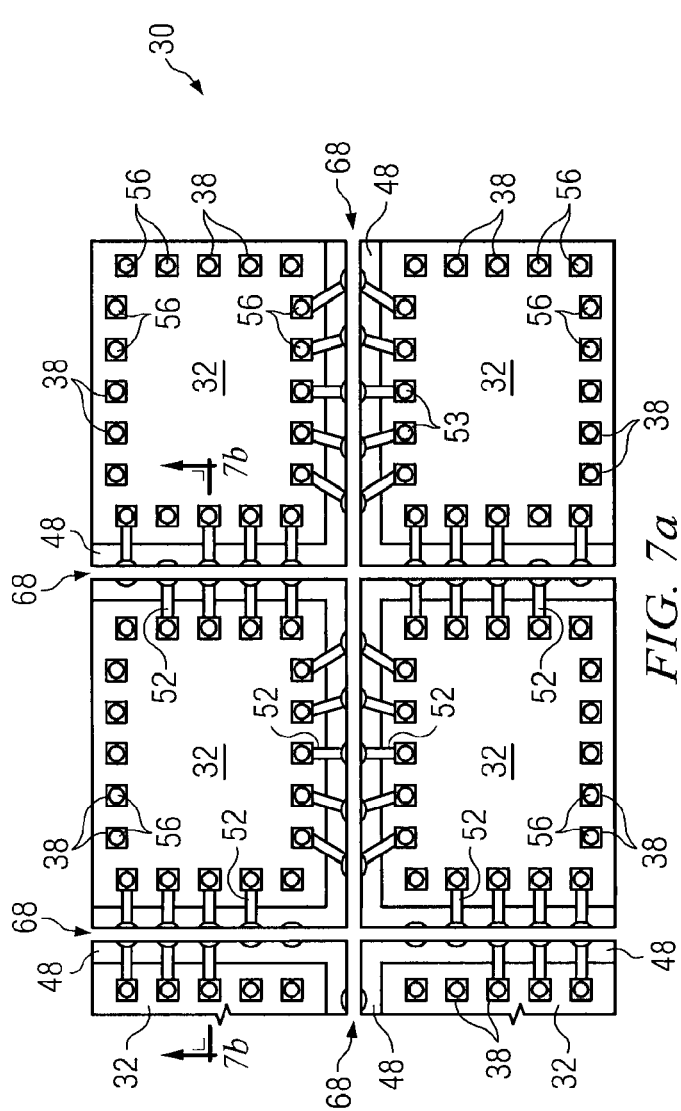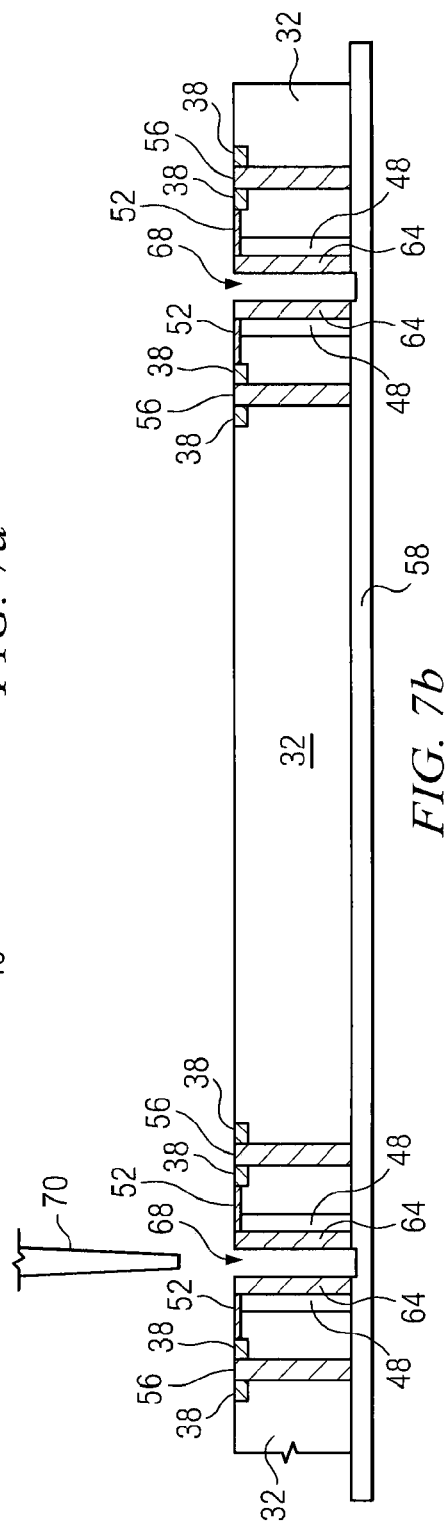
FIG. 7a
FIG. 7b

US 8,815,643 B2

METHOD OF FABRICATING SEMICONDUCTOR DIE WITH THROUGH-HOLE VIA ON SAW STREETS AND THROUGH-HOLE VIA IN ACTIVE AREA OF DIE

CLAIM TO DOMESTIC PRIORITY

The present invention is a division of U.S. patent application Ser. No. 11/861,251, filed Sep. 25, 2007, now U.S. Pat. No. 7,902,638, which is a continuation-in-part of application Ser. No. 11/768,844, filed on Jun. 26, 2007, now U.S. Pat. No. 7,723,159, which is a continuation-in-part of application Ser. No. 11/744,657, filed on May 4, 2007, now U.S. Pat. No. 7,569,421.

FIELD OF THE INVENTION

The present invention relates in general to semiconductor packaging and, more particularly, to stackable semiconductor die having through-hole vias formed along saw streets and through-hole vias on the active silicon area of the die.

BACKGROUND OF THE INVENTION

Semiconductor devices are found in many products used in modern society. Semiconductors find applications in consumer items such as entertainment, communications, networks, computers, and household items markets. In the industrial or commercial market, semiconductors are found in military, aviation, automotive, industrial controllers, and office equipment.

The manufacture of semiconductor devices involves formation of a wafer having a plurality of die. Each die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

Semiconductor manufacturers are increasingly adopting packaging techniques which involve three-dimensional (3D) interconnects between the semiconductor devices. The 3D interconnects provide advantages such as size reduction, reduced interconnect length, and integration of devices with different functionality into an overall 3D package. One way of implementing 3D interconnects involves the use of through-hole vias (THV). THVs are typically located around the perimeter of the die along its saw street guides. Most, if not all, semiconductor packages use the THVs to route signals between adjacent die. However, THVs on saw streets alone limit signal routing options and reduce signal routing density. Present day high density packaging require high density and flexible interconnect capability, which is difficult to achieve through the THVs on saw streets.

A need exists to increase signal routing options and density in a semiconductor wafer having THVs.

SUMMARY OF THE INVENTION

In one embodiment, the present invention is a method of forming a semiconductor device comprising forming a semiconductor wafer having active areas separated from each other by saw street guides, forming contact pads on a first surface of the semiconductor wafer within the active areas, and forming a trench in the saw street guides. The method further comprises filling the trench with organic material, forming first vias in the organic material, and forming second vias through the contact pads on the active area of the die. The method further comprises forming conductive traces between the contact pads and first vias, depositing conductive material in the first vias and second vias to form first conductive vias and second conductive vias, respectively, and singulating the semiconductor wafer along the saw street guides to separate the active areas of the semiconductor wafer into die.

In another embodiment, the present invention is a method of fabricating a semiconductor package comprising forming a semiconductor wafer including die, contact pads disposed on first surfaces of the die, first conductive vias disposed outside a perimeter of the die, second conductive vias disposed in the die, and conductive traces electrically connecting the first conductive vias to the contact pads. The method further comprises forming redistribution layers (RDLs) on second surfaces of the die opposite the first surfaces, forming repassivation layers between the RDLs on the second surface of the die, and singulating the semiconductor wafer to separate the die. The method further comprises stacking the die, and electrically interconnecting the stacked die using the first and second conductive vias.

In yet another embodiment, the present invention is a method of fabricating a semiconductor package comprising providing a first die having contact pads and first conductive vias formed along a perimeter of the die. The first conductive vias are electrically connected to the contact pads by conductive traces, and the first die further includes second conductive vias formed through an active area of the die. The method further comprises providing a second die disposed adjacent to the first die, and electrically connecting the first and second die using bond wires and the first conductive vias.

In still another embodiment, the present invention is a method of fabricating a semiconductor device comprising providing a semiconductor wafer including die and contact pads disposed on a first surface of an active area of each die. The semiconductor wafer includes a saw street guide between each die. The method further includes forming a trench in the saw street guide, filling the trench with an organic material, and forming first conductive vias that are surrounded by the organic material. The method further comprises forming second conductive vias in the active area of the die, and connecting the contact pads and the first conductive vias using conductive traces.

BRIEF DESCRIPTION OF THE DRAWINGS

FIGS. 1*a*-1*b* illustrate top and side views of a semiconductor wafer having a plurality of die separated by saw street guides;

FIGS. 2*a*-2*b* illustrate top and side views of the semiconductor wafer with trenches formed in the saw street guides;

FIGS. 3*a*-3*b* illustrate top and side views of expanding the saw street guides;

FIGS. 5*a*-5*b* illustrate top and side views of forming via holes through the organic material in the saw streets and via holes in an active area of the die;

FIGS. 6*a*-6*b* illustrate top and side views of depositing conductive material in the via holes;

FIGS. 7*a*-7*b* illustrate top and side views of cutting the metal vias on the saw streets into two half-circle vias;

DETAILED DESCRIPTION OF THE DRAWINGS

Figure 4A:
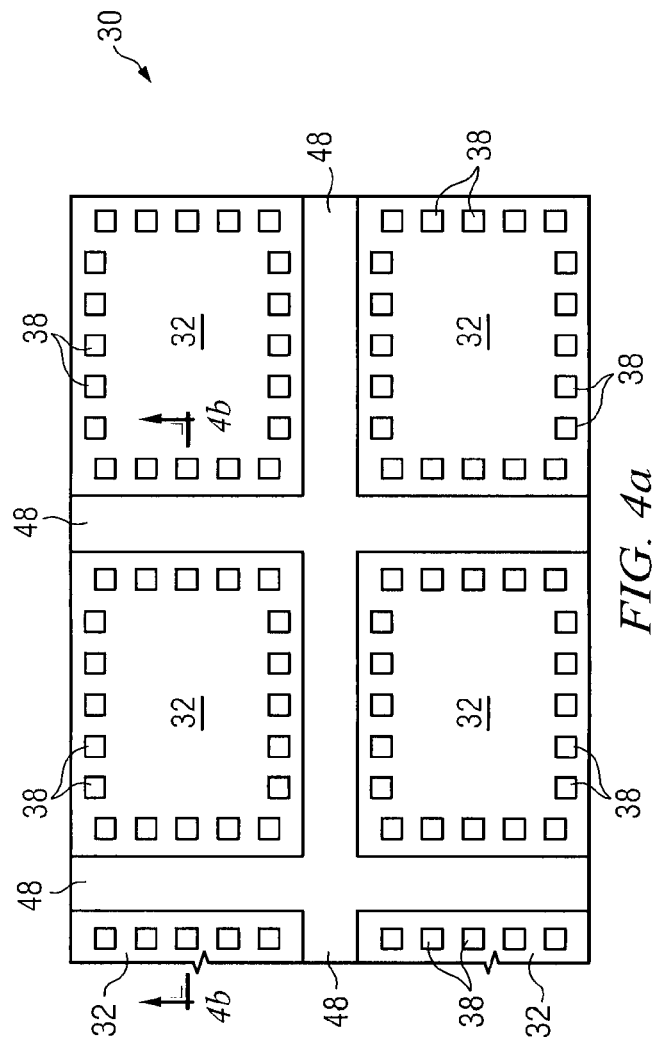
FIGS. 4*a*-4*b* illustrate top and side views of the expanded saw streets filled with organic material.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active front side surface having semiconductor devices disposed thereon, and a backside surface formed with bulk semiconductor material, e.g., silicon. The active front side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Patterning involves the use of photolithography to mask areas of the surface and etch away undesired material to form specific structures. The doping process injects concentrations of dopant material by thermal diffusion or ion implantation. The active surface is substantially planar and uniform with electrical interconnects, such as bond pads.

Flip chip semiconductor packages and wafer level chip scale packages (WLP) are commonly used with integrated circuits (ICs) demanding high speed, high density, and greater pin count. Flip chip style packaging involves mounting an active area of the die facedown toward a chip carrier substrate or printed circuit board (PCB). The active area contains active and passive devices, conductive layers, and dielectric layers according to the electrical design of the die. The electrical and mechanical interconnect is achieved through a solder bump structure comprising a large number of individual conductive solder bumps or balls. The solder bumps are formed on the bump pads which are disposed on the active area. The bump pads connect to the active circuits by conduction tracks or traces in the active area. The solder bumps are electrically and mechanically connected to the contact pads on the carrier substrate by a solder reflow process. The flip chip semiconductor package provides a short electrical conduction path from the active devices on the die to conduction tracks on the carrier substrate in order to reduce signal propagation, lower capacitance, and achieve overall better circuit performance.

In the present discussion, a WLP is provided having through-hole vias (THV) formed along saw streets. The backside of the wafer has redistribution layers (RDL) for interconnect flexibility separated by repassivation layers. WLP with THV formed along saw streets are described in U.S. patent application Ser. No. 11/744,657, entitled "Through-Hole Via on Saw Streets", and further in U.S. patent application Ser. No. 11/768,844, entitled "Package on Package Using Through-Hole Via Die on Saw Streets", which are incorporated herein by reference.

Turning to FIG. 1a, a semiconductor wafer 30 is shown having a plurality of die 32. The die are separated by inter die wafer area 36, commonly known as saw street guides. The saw street guides are routed around the wafer such that there is a saw street on every side of each die on the wafer, i.e., around a perimeter of the die. Each die 32 has a plurality to contact pads 38 formed on silicon, i.e., formed in an active area of die 32 and not in saw street guides 36. Contact pads 38 are made of aluminum, copper, or aluminum/copper alloys. Contact pads 38 electrically connect to active and passive devices through conduction tracks or layers formed on die 32. The contact pads can be disposed side-by-side a first distance from the edge of the die, as shown in FIG. 1a. Alternately, the contact pads can be offset in multiple rows such that a first row of contact pads are disposed a first distance from the edge of the die, and a second row of contact pads alternating with the first row are disposed a second distance from the edge of the die. A solder bump or wire bond will later be formed to connect to each metal contact pad for electrical and mechanical interconnect to a chip carrier substrate or printed circuit board (PCB).

FIG. 1b is a cross-sectional view of wafer 30, taken along line 1b-1b in FIG. 1a, showing die 32 separated by saw street guides 36. In one embodiment, die 32 may have dimensions ranging from 2×2 millimeters (mm) to 15×15 mm. The saw streets provide cutting areas to singulate the wafer into individual die. A first die 32 is disposed to the left of the leftmost saw street 36. A second die 32 is disposed between the saw streets 36. A third die 32 is disposed to the right of the rightmost saw street 36. Once the wafer is singulated, each set of contact pads disposed on the respective die will provide the electrical and mechanical interconnect for that die.

In FIG. 2a, semiconductor wafer 30 is again shown with its plurality of die 32, separated by saw street guides 36. Dicing tape 40 is applied to the back of semiconductor wafer 30 for structural support of the wafer during the following manufacturing operations, as shown in FIG. 2b which is a cross-sectional view taken along line 2b-2b. Saw streets 36 are cut by cutting tool 44. In one embodiment, cutting tool 44 can be a saw or laser. Note that the cutting tool completely severs through wafer 30 to form a well or trench 42. The bottom of trench 42 is defined by dicing tape 40. The formation of trench 42 arises from a first singulation of wafer 30, which creates a trench width that is less than a width of the channel of saw street guide 36.

In FIG. 3a, semiconductor wafer 30 is shown with its plurality of die 32, separated by cut saw street guides 36. Wafer 30 undergoes a wafer expansion step to increase the width of saw street guides 36. FIG. 3b is a cross-sectional view of wafer 30, taken along line 3b-3b, showing the die being pulled using a wafer expansion table as shown by directional arrows 46. Alternately, the die can be picked and placed onto a wafer support system. In any case, the die are positioned farther apart following the steps of FIGS. 3a-3b to create wider saw street guides. In one embodiment, the die separation increases from 50 micrometers (μm) to 200 μm. The expanded dimension depends on the design embodiment, i.e. half via, full via, single row via, or double/multiple row via.

Figure 4B:
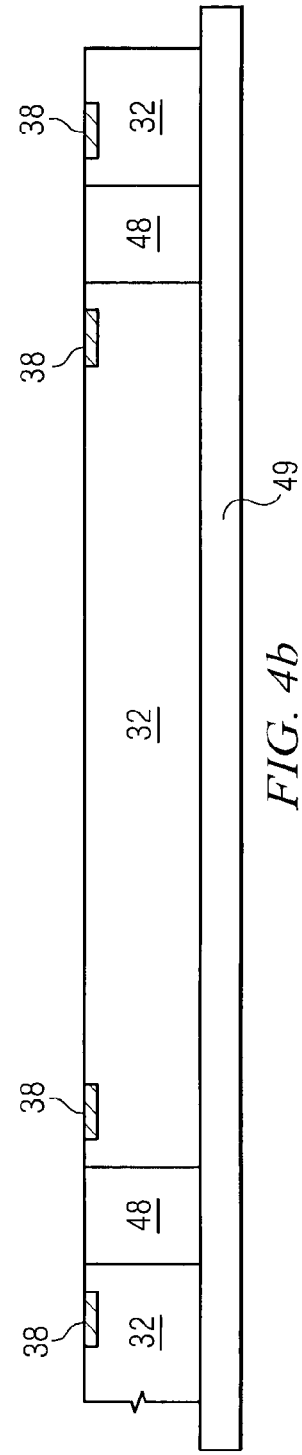

In FIG. 4a, semiconductor wafer 30 is shown with its plurality of die 32, separated by cut saw street guides 36. Organic material 48 is deposited in trench 42 by spin-coating or needle dispensing. Organic material 48 can be benzocyclobutene (BCB), polyimide (PI), or acrylic resin. FIG. 4b is a cross-sectional view of wafer 30, taken along line 4b-4b, showing organic material 48 deposited in trench 42. Organic material 48 fills trench 42 from dicing tape 40 up to the top surface of die 32. The backside of wafer 30 is transferred onto wafer support system 49, which is made from glass, silicon substrate, or other wafer support material.

In FIG. 5a, semiconductor wafer 30 is shown with its plurality of die 32, separated by saw street guides 36 filled with organic material 48. A via hole 50 is cut into organic material 48 along saw streets 36. The via cutting operation uses a laser drill or etching process. Via holes 50 are placed along die 32 adjacent to contact pads 38. In one embodiment, contact pads 38 and via holes 50 have a minimum separation distance of about 20 μm to 150 μm, depending on the diameter and depth of the via.

In FIG. 5b, the cross-sectional view of wafer 30, taken along line 5b-5b, shows via holes 50 cut into organic material 48 down to wafer support system 49. The laser drilling operation is centered about the channel of the saw street guide and makes a hole having a diameter less than the width of trench 42, which leaves a layer of organic material 48 surrounding via hole 50. The width of trench 42 is dependent on the width of saw street width, but typically smaller than the saw street width. The diameter of via hole 50 is typically about 10 μm to 100 μm, depending on the required via depth. In addition, via holes 53 are cut through contact pads 38 down through wafer 30 to wafer support system 49. The laser drilling operation is centered about contact pad 38 and makes a hole having a diameter less than the width of the contact pad, which leaves part of the contact pad surrounding via hole 53 at the top of die 32. Note that via holes 53 are formed on silicon, i.e., through an active area of die 32.

A metal track or trace 52 is routed from each contact pad 38 to the corresponding via hole 50. Trace 52 is formed by a metal patterning process to connect contact pads 38 to via holes 50, which will be filled with conductive material in a later step. Traces 52 are provided for each contact pad and via hole pairing as shown. Some via holes 50 are dummy vias performing no electrical function. Accordingly, metal trace 52 need not be routed to every via depending on the device function.

In FIG. 6a, semiconductor wafer 30 is shown with its plurality of die 32, separated by saw street guides 36 with metal-filled vias 54 and 56. A conductive material is deposited into via holes 50 through a deposition process such as plating or plugging to form metal vias 54. The same conductive material is also deposited into via holes 53 to form metal vias 56. Metal vias 56 are formed through an active area of die 32. The conductive material can be copper (Cu), aluminum (Al), tungsten (W), or alloys thereof, or mixtures of other conductive materials. Metal vias 54 are formed in and are surrounded by organic material 48. Metal vias 56 are formed in and are surrounded by contact pad 38 and the active area of wafer 30. Metal via 54 electrically connects to contact pad 38 by way of trace 52. Traces 52 are provided for each contact pad and metal via pairing as shown. FIG. 6b is a cross-sectional view of wafer 30, taken along line 6b-6b, showing metal vias 54 electrically connecting to contact pads 38 through traces 52, and metal vias 56 electrically connecting to contact pads 38 directly. Wafer support system 49 is replaced with dicing tape 58 for structural support of the wafer during the second or final singulation to separate die 32. The bottom of metal vias 54 and 56 coincides with dicing tape 58.

A redistribution layer (RDL) can be formed on the backside of wafer 30. The backside RDL operates as an intermediate conductive layer to route electrical signals to various areas of the die, including active and passive circuits, and provides various electrical interconnect options during package integration, such as shown in FIGS. 15-18. A repassivation layer is formed between the individual nodes of the backside RDL for electrical isolation. The formation of backside RDL and repassivation layer is disclosed in U.S. patent application Ser. No. 11/861,244 (Pending), entitled "Semiconductor Wafer having Through Hole Vias on Saw Streets with backside redistribution layer."

In FIGS. 7a-7b, metal vias 54 are cut through center area 68 by cutting tool 70. In one embodiment, cutting tool 70 can be a saw or laser. The cut extends down to dicing tape 58 to completely sever metal vias 54 into two equal half-circle vias 64. A pick and place operation removes die 32 as individual units from dicing tape 58.

Figure 8A:
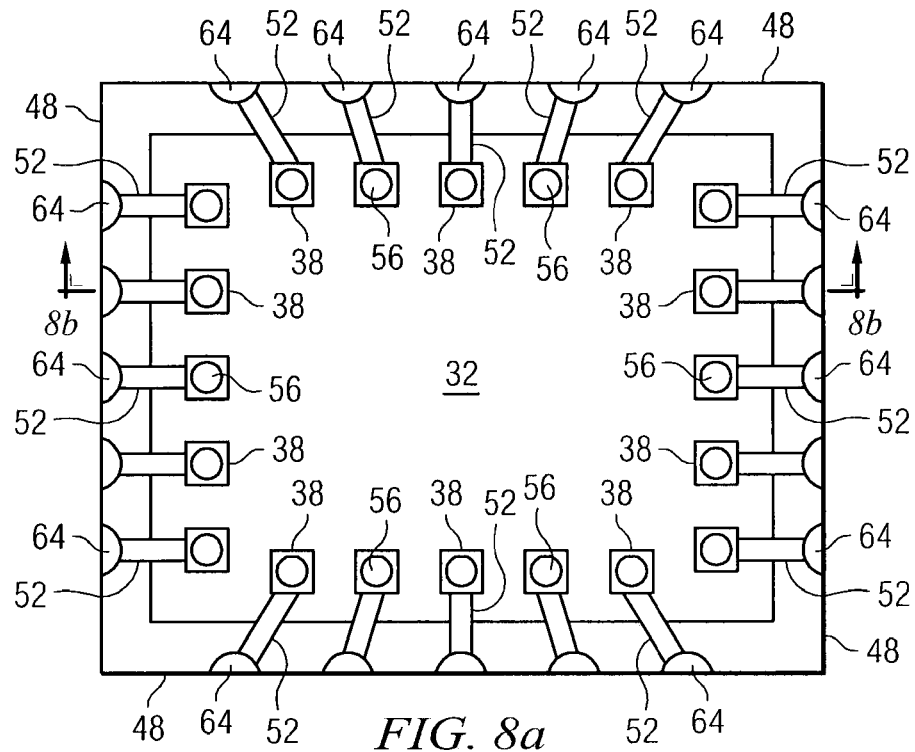
FIGS. 8a-8b illustrate top and side views of a semiconductor die with metal vias formed along the saw streets and metal vias formed in the active area of the die.
Figure 8B:
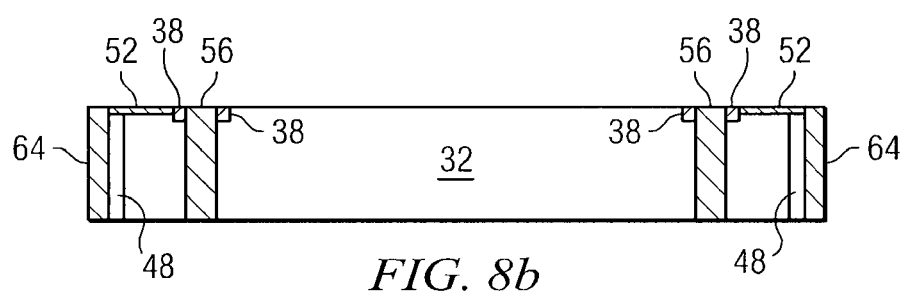

In FIG. 8a, semiconductor die 32 is shown with both metal vias 64 on saw streets and through silicon metal vias 56. FIG. 8b is a cross-sectional view of die 32, taken along line 8b-8b, showing metal vias formed through silicon of die 32 and metal vias on saw street configuration, as produced by the manufacturing steps of FIGS. 1-7.

Figure 9A:
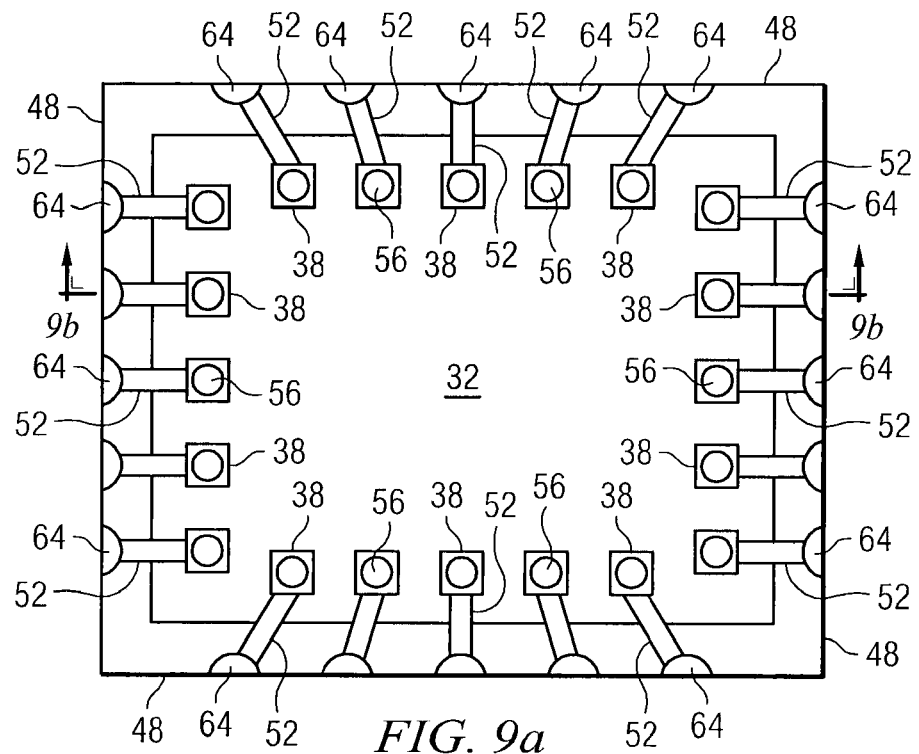
FIGS. 9a-9b illustrate top and side views of a semiconductor die with redistribution layers formed on a backside of the die.
Figure 9B:
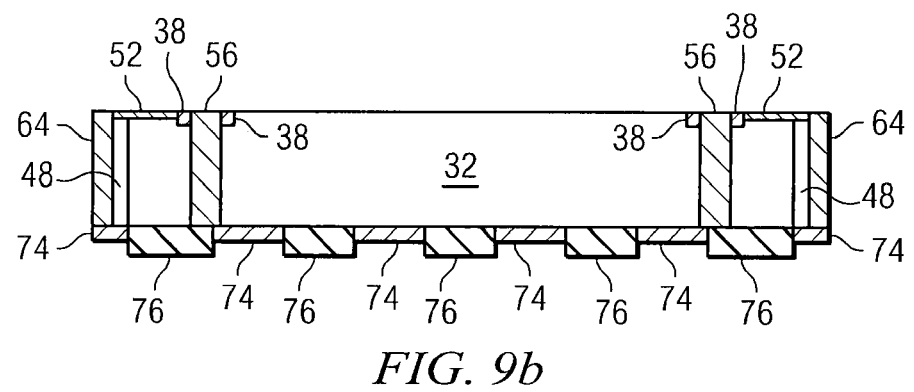

In FIG. 9a, semiconductor die 32 is shown with through silicon metal vias 56 and further metal vias 64 on saw streets. FIG. 9b is a cross-sectional view of die 32, taken along line 9b-9b, showing metal vias formed through silicon of die 32 and metal vias on saw street configuration, as produced by the manufacturing steps of FIGS. 1-7. RDL 74 and repassivation layer 76 are shown on the backside of die 32. RDL 74 can be made with nickel (Ni), nickel vanadium (NiV), Cu, or Cu alloy. RDL 74 operates as an intermediate conductive layer to route electrical signals to various areas of the die, including active and passive circuits, and provides various electrical interconnect options during package integration, such as shown in FIGS. 15-18. Repassivation layer 76 is formed between the individual nodes of backside RDL 74 for electrical isolation. The repassivation layer can be made with silicon nitride (SiN), silicon dioxide (SiO2), silicon oxynitride (SiON), polyimide, benzocyclobutene (BCB), polybenzoxazole (PBO), or other insulating material.

Figure 10A:
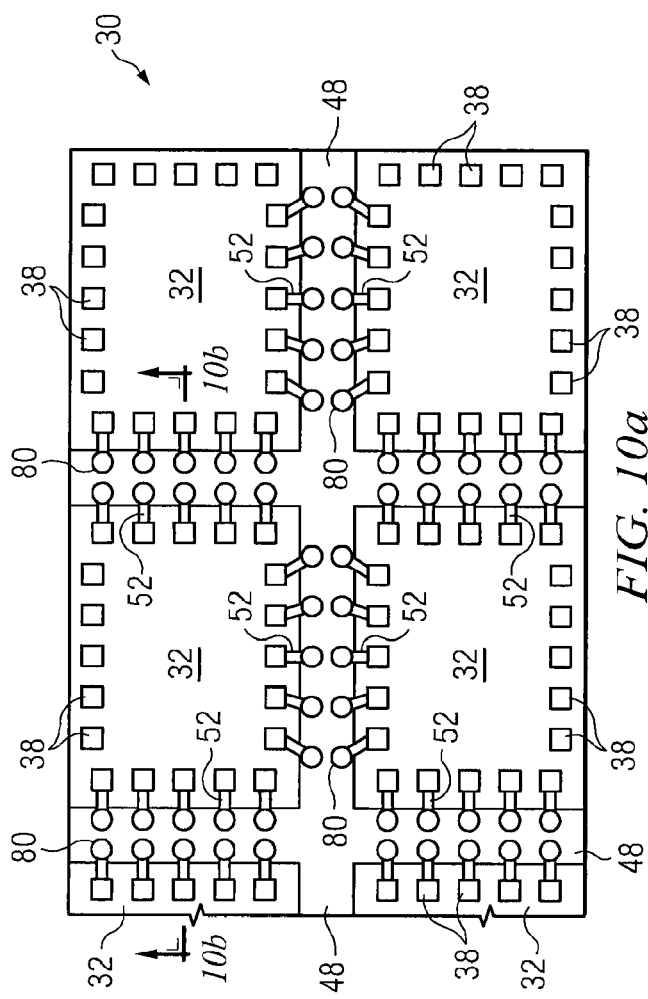
FIGS. 10a-10b illustrate top and side views of two side-by-side metal vias formed along the saw streets.
Figure 10B:
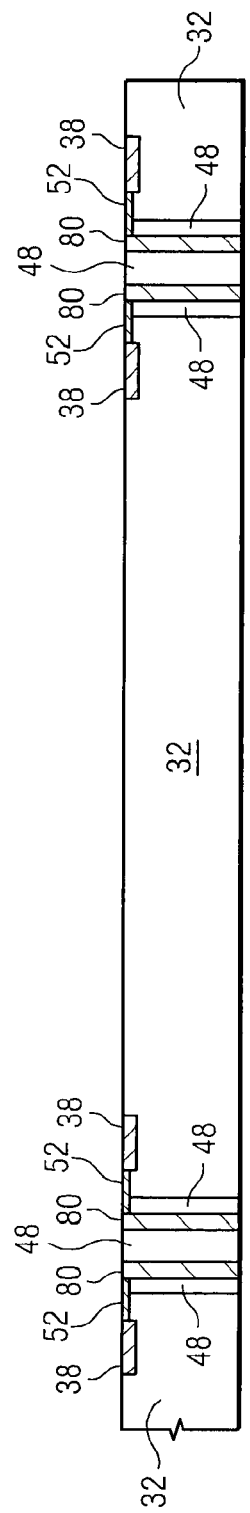

In FIG. 10a, semiconductor die 32 is shown with contact pads 38 connected to metal vias 80 by traces 52. FIG. 10b is a cross-sectional view of die 32, taken along line 10b-10b, showing metal vias 80 along saw street 36. The metal via is produced by the steps described in FIGS. 1-7, with the exception that two via holes like 50 are formed side-by-side in organic material 48. The side-by-side via holes 50 are separated by organic material 48. Conductive traces 52 connect contact pads 38 and via holes 50. The side-by-side via holes are filled with conductive material to form metal vias 80.

Figure 11A:
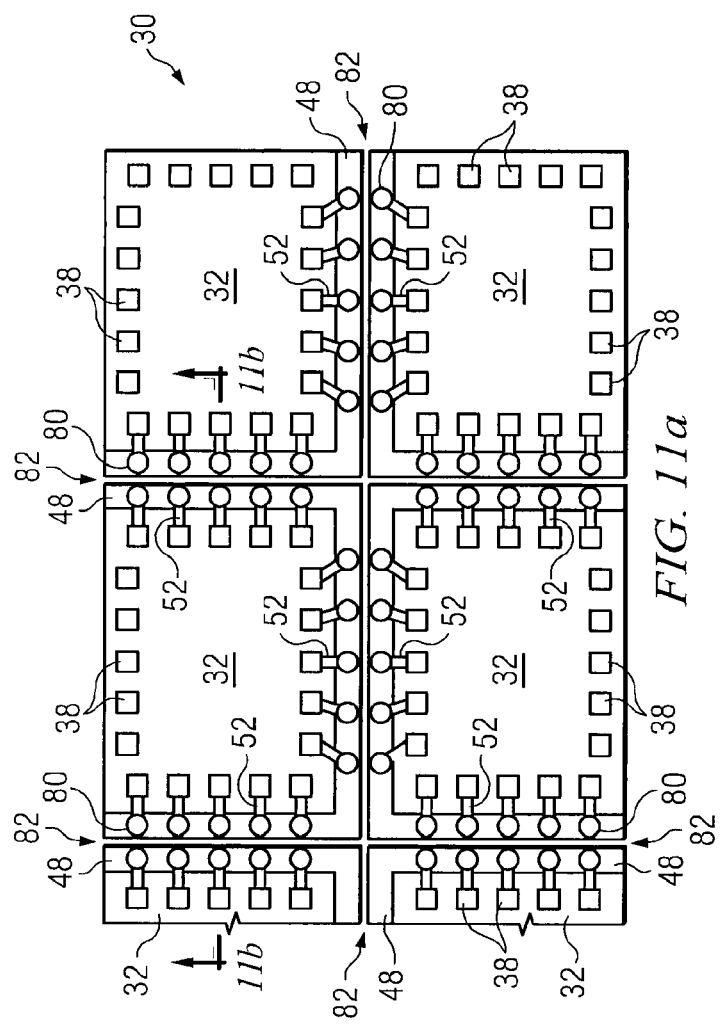
FIGS. 11a-11b illustrate top and side views of cutting the organic material between the two side-by-side metal vias to separate the die.
Figure 11B:
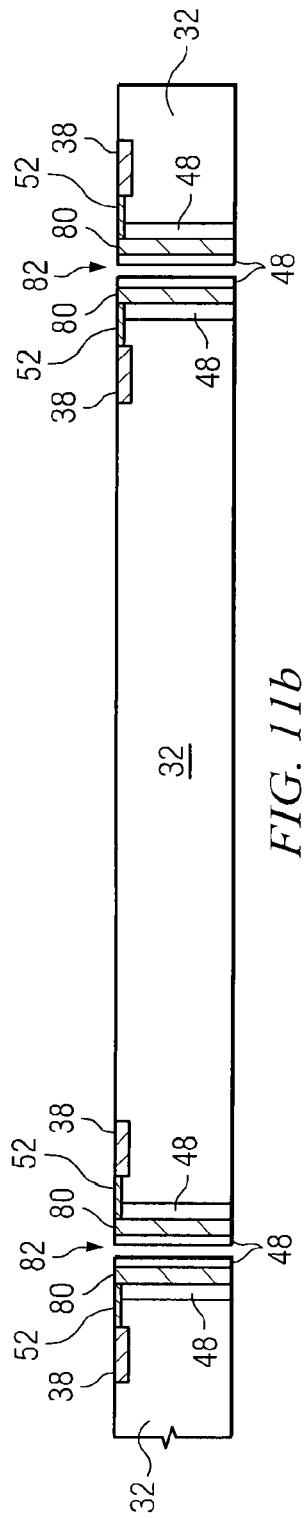

In FIG. 11a, semiconductor die 32 is shown with contact pads 38 connected to metal vias 80 by traces 52. Dicing tape is applied to the back of semiconductor wafer 30 for structural support of the wafer during the final singulation to separate die 32, as shown in FIG. 11b which is a cross-sectional view taken along line 11b-11b. The second or final singulation to separate the plurality of die 32 is cut through organic material 48 along line 82 between the side-by-side vias 80 with a cutting tool like 70. The singulation between metal vias 80 results in the metal vias on saw street configuration in combination with through silicon vias 56.

Figure 12A:
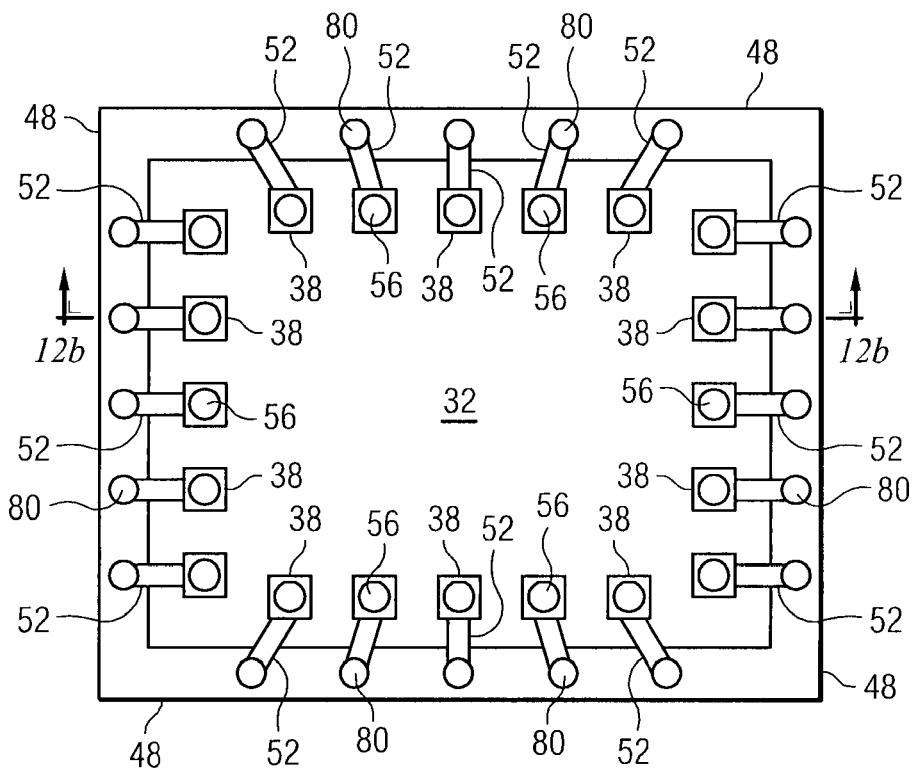
FIGS. 12a-12b illustrate top and side views of a semiconductor die with full-circle vias along the saw streets and vias formed in the active area of the die.
Figure 12B:
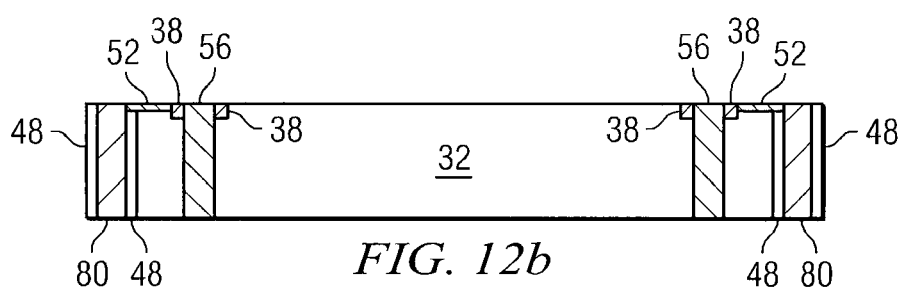

In FIG. 12a, semiconductor die 32 is shown with contact pads 38 connected to metal vias 80 by traces 52. FIG. 12b is a cross-sectional view of die 32, taken along line 12b-12b, showing metal vias on saw street configuration. The metal full-circle vias are produced by the steps described in FIGS. 1-7 and 10-11. The side-by-side via holes like 50 are separated by organic material 48. Conductive traces like 52 electrically connect the contact pads and via holes. The side-by-side via holes are filled with conductive material to form metal vias 80. The final singulation to separate the plurality of die 32 is cut through organic material 48 between the side-by-side metal vias 80 resulting in the metal via on saw street configuration in combination with through silicon vias 56.

Figure 13:
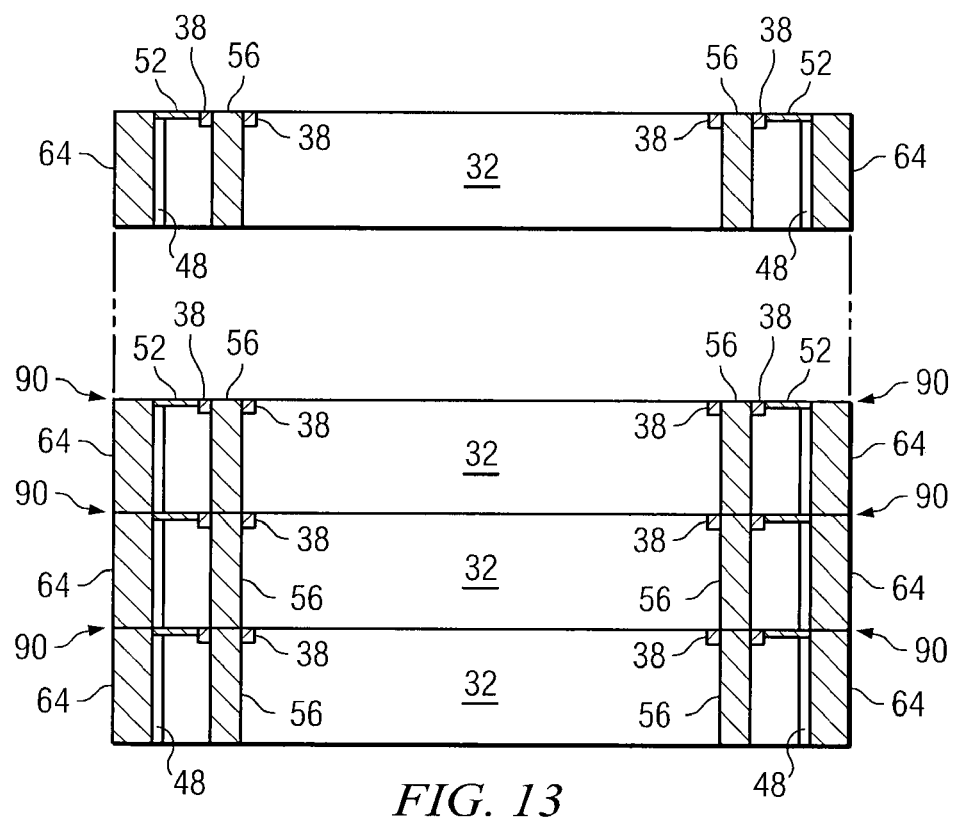
FIG. 13 illustrates die-to-die stacking using direct metal-to-metal via bonding.

FIG. 13 illustrates direct die-to-die stacking using direct via metal bonding. A plurality of die 32 is stacked as shown to suit a particular application. Each of the metal half-vias 64 and through silicon vias 56 can be joined together as shown by union 90 using a direct via metal bonding process. The combination of vias 64 and 56 provide greater interconnect flexibility and options for electrically connecting the stacked die 32. Alternately, semiconductor die 32 with metal full-vias 80 and through silicon vias 56 can be joined together by union 90 using a direct via metal bonding process.

Figure 14:
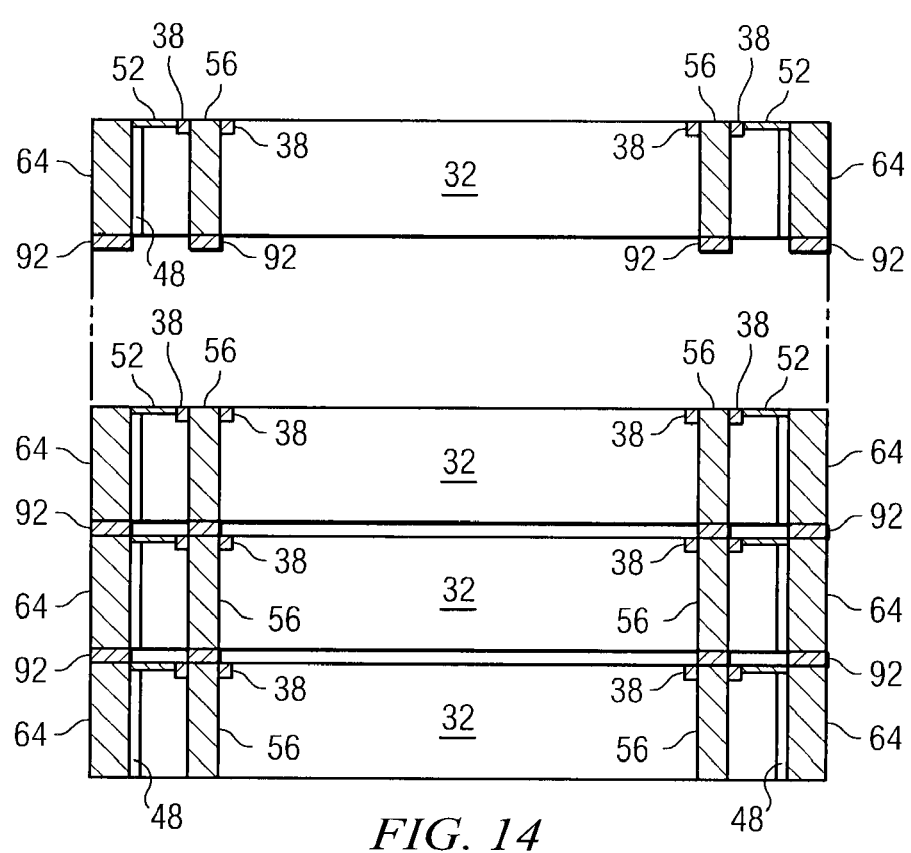
FIG. 14 illustrates die-to-die stacking using via bonding with solder paste.

FIG. 14 illustrates die-to-die stacking using via bonding with solder paste 92. A plurality of die 32 is stacked as shown to suit a particular application. Each of the metal vias 64 and through silicon vias 56 can be joined together as shown by reflowing solder paste 92 to create a strong metallurgical bond between each of stacked die 32. The combination of vias 64 and 56 provide greater interconnect flexibility and options for electrically connecting the stacked die 32. Alternately, semiconductor die 32 with metal vias 80 and through silicon vias 56 can be joined together by solder paste 92 using a reflow process.

Figure 15:
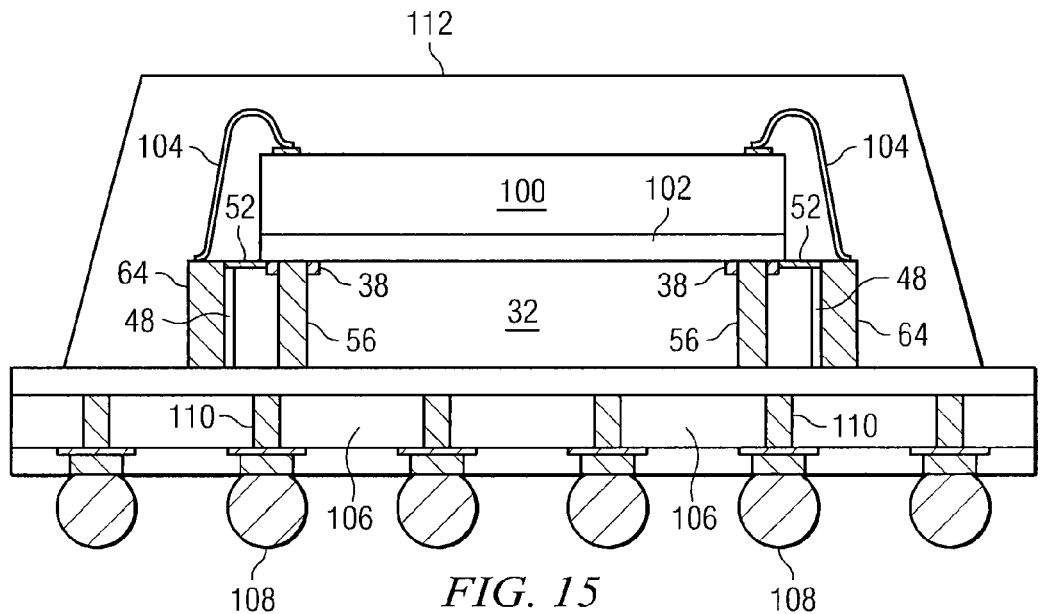
FIG. 15 illustrates the semiconductor die with metal vias connected to a second die with wire bonds.

In FIGS. 15-18 shows various packaging applications using, in part, an interconnect technique with the THVs formed on saw streets and THVs on silicon. FIG. 15 has semiconductor die 100 attached to die 32 with adhesive 102. Die 100 electrically connects through wire bonds 104 to metal vias 64 on die 32. Die 32 is supported by substrate 106. Metal vias 64 and 56 electrically connect to solder bumps 108 through conductive layer 110. The packages are sealed by epoxy encapsulant 112.

Figure 16:
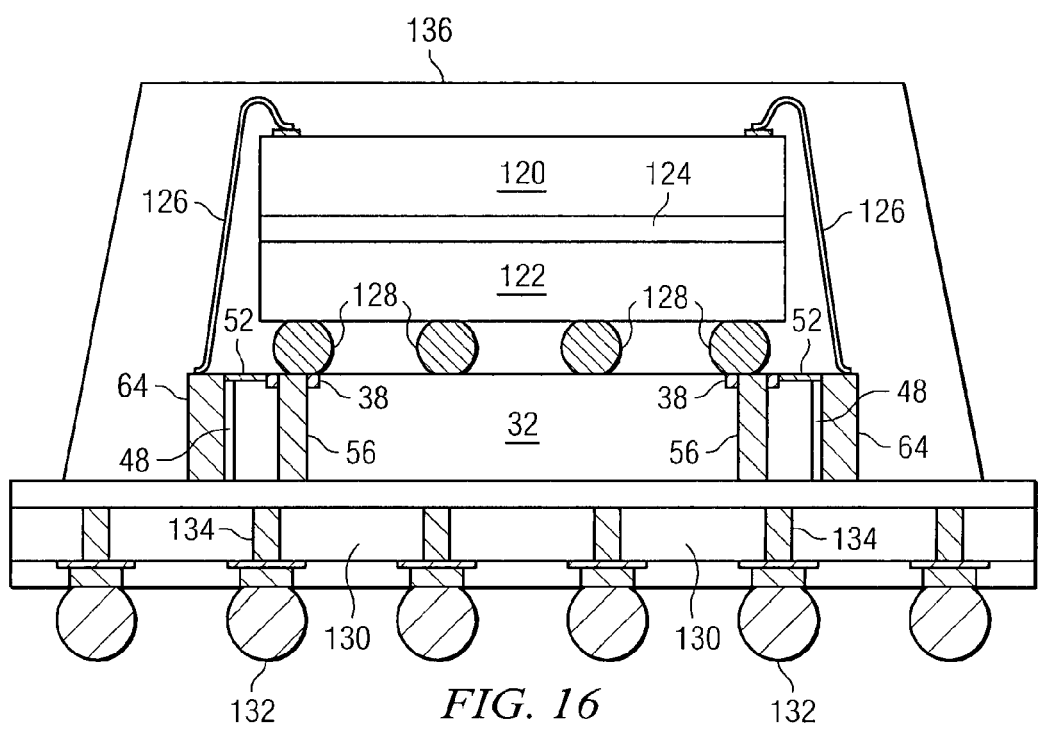
FIG. 16 illustrates the semiconductor die with metal vias connected to a second die with bond wires and solder bumps.

FIG. 16 shows semiconductor die 120 attached to die 122 with adhesive 124. Die 120 electrically connects through wire bonds 126 to metal vias 64 on die 32. Die 122 electrically connects through solder bumps 128 to metal vias 56 on die 32. Die 32 is supported by substrate 130. Metal vias 64 and 56 electrically connect to solder bumps 132 through conductive layer 134. The packages are sealed by epoxy encapsulant 136.

Figure 17:
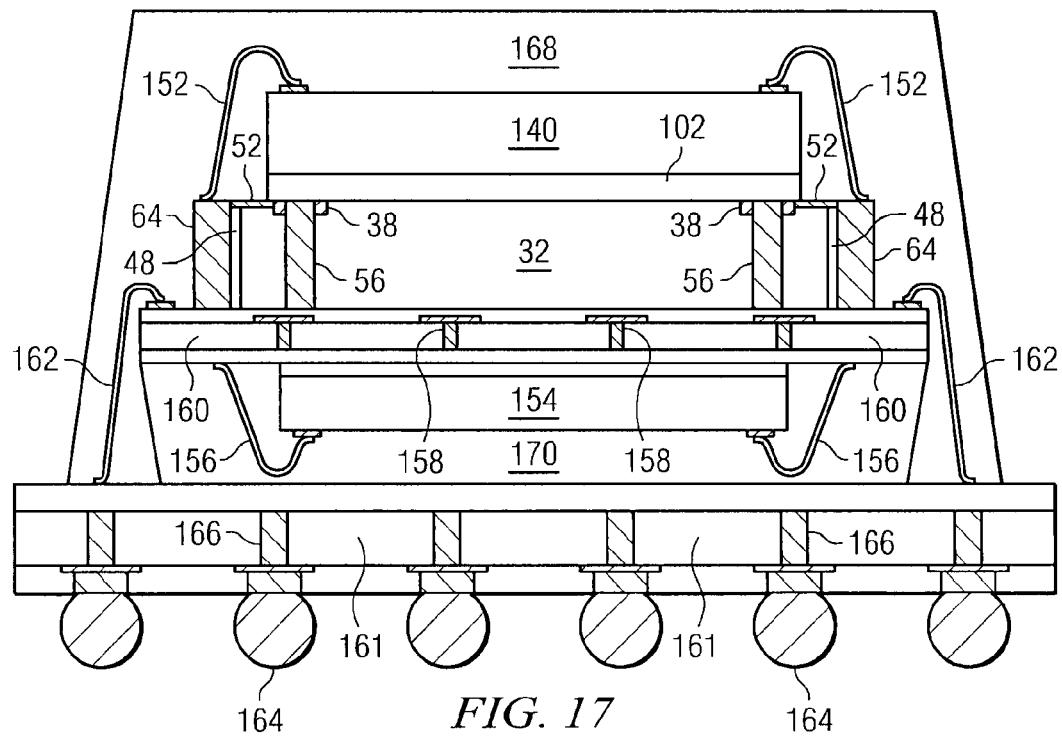
FIG. 17 illustrates another embodiment of interconnecting die using metal vias on saw streets and metal vias in the active area of the die.

FIG. 17 shows semiconductor die 140 electrically connected to metal vias 64 or 80 on die 32 by way of bond wires 152. Semiconductor die 154 electrically connects to metal vias 64 and 56 on die 32 by way of wire bonds 156 and conductive layer 158. Die 32 and 140 are supported by substrate 160. The entire assembly is mounted to substrate 161. Wire bonds 162 from substrate 160 provide the electrical connection to solder bumps 164 through conductive layer 166. The packages are encased by epoxy encapsulant 168. Molding compound 170 encapsulates die 154.

Figure 18:
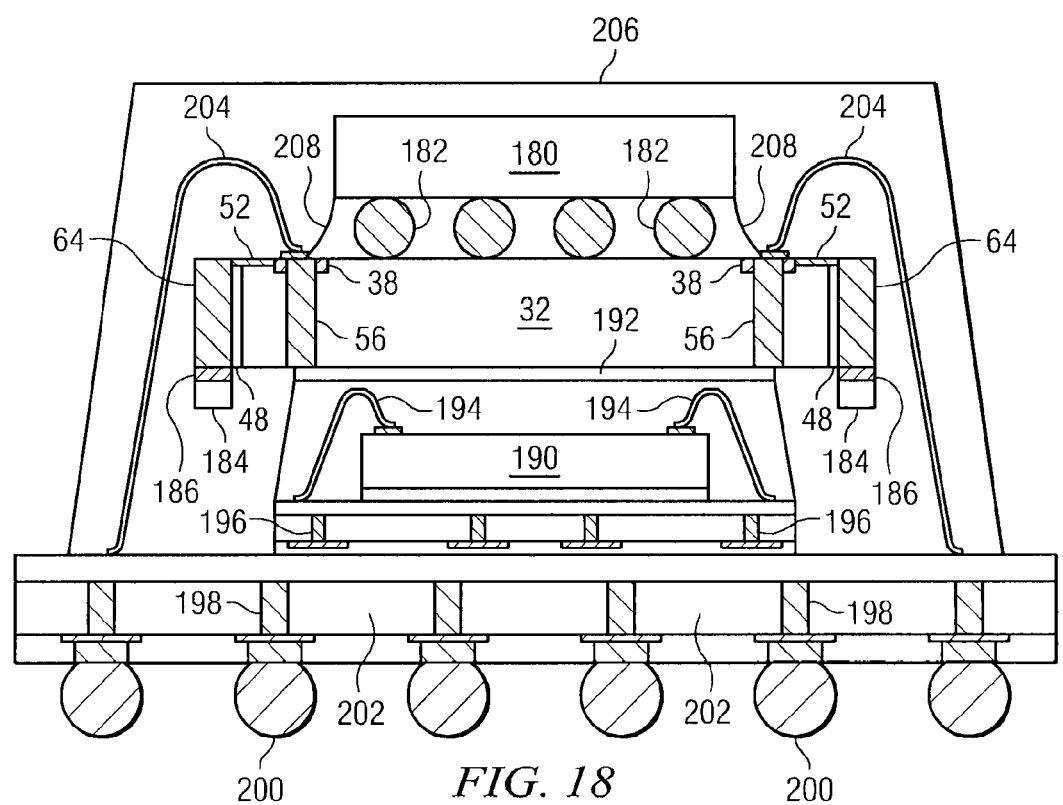
FIG. 18 illustrates another embodiment of interconnecting die using metal vias on saw streets and metal vias in the active area of the die.

FIG. 18 shows semiconductor die 180 electrically connected to die 32 with solder bumps 182. Passive devices 184 also connect to metal vias 64 with solder paste 186. Die 32 is mounted to a semiconductor package containing die 190 with adhesive 192. Die 190 electrically connects to solder bumps 200 through wire bonds 194, conductive layer 196, and conductive layer 198. The assembly of semiconductor die 32, 180, and 190 are supported by substrate 202. Metal vias 56 electrically connect to solder bumps 200 through wire bonds 204 and conductive layer 198. The packages are sealed by epoxy encapsulant 206. An underfill material 208 provides stress relief.

In summary, stackable semiconductor die has been described with THVs formed in the saw streets and THVs formed on silicon. The electrical interconnect is accomplished using the THVs on saw streets and THVs on silicon, in addition to a redistribution layer, separated by a repassivation layer, to increase signal routing options and density. The THVs on saw streets and THVs on silicon, in addition to the RDLs, provide more signal routing functionality and flexibility within the package.

While one or more embodiments of the present invention have been illustrated in detail, the skilled artisan will appreciate that modifications and adaptations to those embodiments may be made without departing from the scope of the present invention as set forth in the following claims

What is claimed:

1. A method of making a semiconductor device, comprising:
    forming a semiconductor wafer including active areas separated from each other by saw street guides;
    forming contact pads on a first surface of the semiconductor wafer within the active areas;
    forming a trench in the saw street guides;
    filling the trench with organic material;
    forming first vias in the organic material;
    forming second vias through the contact pads on the active areas of the semiconductor wafer;
    forming conductive traces between the contact pads and first vias;
    depositing conductive material in the first vias and second vias to form first conductive vias and second conductive vias, respectively; and
    singulating the semiconductor wafer along the saw street guides to separate the active areas of the semiconductor wafer into die.

2. The method of claim 1, further including:
    forming redistribution layers (RDLs) on a second surface of the semiconductor wafer that is opposite the first surface; and
    forming insulating layers between the RDLs.

3. The method of claim 1, further comprising:
stacking the die; and
electrically interconnecting the die using the first and second conductive vias.

4. The method of claim 1, wherein forming first vias in the organic material comprises forming a first via directly between a first contact pad disposed in a first active area and a second contact pad disposed in a second active area adjacent to the first active area.

5. The method of claim 4, wherein singulating the semiconductor wafer along the saw street guides comprises dicing through a first conductive via disposed in the first via to form a third conductive via that is electrically connected to the first contact pad by a first conductive trace and a fourth conductive via that is electrically connected to the second contact pad by a second conductive trace.

6. The method of claim 1, wherein forming first vias in the organic material comprises forming two of the first vias side by side and directly between a first contact pad disposed in a first active area and a second contact pad disposed in a second active area adjacent to the first active area.

7. The method of claim 6, wherein singulating the semiconductor wafer comprises cutting the semiconductor wafer between two of the first conductive vias.

8. A method of making a semiconductor package, comprising:
forming a semiconductor wafer including die, contact pads disposed on first surfaces of the die, first conductive vias disposed outside a perimeter of the die, second conductive vias disposed in the die, and conductive traces electrically connecting the first conductive vias to the contact pads;
forming redistribution layers (RDLs) on second surfaces of the die opposite the first surfaces;
forming repassivation layers between the RDLs on the second surface of the die;
singulating the semiconductor wafer to separate the die;
stacking the die; and
electrically interconnecting the stacked die using the first and second conductive vias.

9. The method of claim 8, wherein singulating the semiconductor wafer comprises cutting through at least one of the first conductive vias to form a third conductive via electrically connected to a first contact pad by a first conductive trace and a third conductive via electrically connected to a second contact pad by a second conductive trace.

10. The method of claim 8, wherein two of the first conductive vias are formed side by side and directly between a first contact pad disposed on a first die and a second contact pad disposed on a second die adjacent to the first die.

11. The method of claim 10, wherein singulating the semiconductor wafer comprises cutting along a saw street guide disposed between the two of the first conductive vias.

12. A method of making a semiconductor package, comprising:
providing a first die including contact pads and first conductive vias formed along a perimeter of the first die, the first conductive vias electrically connected to the contact pads by conductive traces, the first die further including second conductive vias formed through an active area of the first die;
providing a second die disposed adjacent to the first die; and
electrically connecting the first and second die using bond wires and the first conductive vias.

13. The method of claim 12, wherein two of the first conductive vias are formed side by side.

14. The method of claim 13, further comprising:
providing a semiconductor wafer including the first die and second die and including a third conductive via formed along the perimeter of the second die; and
singulating the semiconductor wafer along a saw street guide disposed between the first and third conductive vias.

15. A method of making a semiconductor device, comprising:
providing a semiconductor wafer including a plurality of semiconductor die and contact pads disposed on a first surface of each semiconductor die;
forming a trench completely through the semiconductor wafer;
depositing an organic material in the trench;
forming first vias in the organic material;
forming second vias in the semiconductor die;
depositing a conductive material in the first vias and second vias to form first conductive vias and second conductive vias; and
forming a plurality of conductive traces to electrically connect the contact pads and the first conductive vias.

16. The method of claim 15, further including:
forming redistribution layers (RDLs) on a second surface of the die opposite the first surface; and
forming insulating layers between the RDLs on the second surface of the die.

17. The method of claim 15, further comprising:
stacking the die; and
electrically interconnecting the stacked die using the first and second conductive vias.

18. The method of claim 15, wherein at least one of the first conductive vias is formed directly between a first contact pad disposed on a first die and a second contact pad disposed on a second die that is adjacent to the first die.

19. The method of claim 18, further comprising singulating the semiconductor wafer through the at least one of the first conductive vias to form a third conductive via that is electrically connected to the first contact pad by a first conductive trace and to form a fourth conductive via that is electrically connected to the second contact pad by a second conductive trace.

20. The method of claim 15, wherein two of the first conductive vias are formed side by side and directly between a first contact pad disposed on a first die and a second contact pad disposed on a second die that is adjacent to the first die.

21. The method of claim 20, further comprising singulating the semiconductor wafer along a saw street guide disposed between the two of the first conductive vias.

22. The method of claim 16, further comprising forming conductive bumps that are electrically connected to the RDLs.

23. A method of making a semiconductor device, comprising:
providing a plurality of semiconductor die;
forming a trench to completely sever the semiconductor die;
depositing an organic material in the trench between the severed semiconductor die;
forming a first conductive via through the organic material; and
singulating the semiconductor die through the first conductive via to form a second and third conductive via.

24. The method of claim 23, further including:
forming a contact pad over the semiconductor die; and
forming a conductive trace over the semiconductor die to electrically connect the contact pad and second conductive via.

25. The method of claim 23, further including:
stacking the plurality of semiconductor die; and
electrically connecting the stacked semiconductor die through the second and third conductive vias.

26. The method of claim 23, wherein the first conductive via is formed directly between a first contact pad of a first semiconductor die and a second contact pad of a second semiconductor die.

27. A method of making a semiconductor device, comprising:
providing a first semiconductor die;
forming a first via outside a footprint of the first semiconductor die;
forming a second via in the first semiconductor die; and
depositing a conductive material in the first via and second via to form a first conductive via and a second conductive via.

28. The method of claim 27, further including:
forming a contact pad on a first surface of the first semiconductor die;
forming redistribution layers (RDLs) on a second surface of the die opposite the first surface; and
forming insulating layers between the RDLs on the second surface of the die.

29. The method of claim 27, further comprising:
stacking the die; and
electrically interconnecting the stacked die using the first and second conductive via.

30. The method of claim 27, wherein the first conductive via is formed directly between a first contact pad disposed on the first semiconductor die and a second contact pad disposed on a second semiconductor die adjacent to the first die.

* * * * *